United States Patent [19]
Iwanaga et al.

[11] Patent Number: 5,962,180
[45] Date of Patent: Oct. 5, 1999

[54] RADIATION SENSITIVE COMPOSITION

[75] Inventors: Shinichiro Iwanaga, Yokkaichi; Akihiko Sakurai, Fukui; Takayoshi Tanabe, Yokkaichi; Akira Tsuji, Yokohama, all of Japan

[73] Assignee: JSR Corporation, Tokyo, Japan

[21] Appl. No.: 08/806,676

[22] Filed: Feb. 26, 1997

[30] Foreign Application Priority Data

Mar. 1, 1996 [JP] Japan ..................................... 8-044476

[51] Int. Cl.$^6$ ................................................... G03F 7/004
[52] U.S. Cl. ........................ 430/170; 430/270.1; 430/905; 430/910
[58] Field of Search .................. 430/270.1, 905, 430/910, 170

[56] References Cited

U.S. PATENT DOCUMENTS

| | | | |
|---|---|---|---|
| 5,468,589 | 11/1995 | Urano et al. | 430/270.1 |
| 5,482,816 | 1/1996 | Murata et al. | 430/270.1 |
| 5,556,734 | 9/1996 | Yamachika et al. | 430/270.1 |
| 5,558,976 | 9/1996 | Urano et al. | 430/270.1 |
| 5,585,218 | 12/1996 | Nakano et al. | 430/270.1 |
| 5,627,006 | 5/1997 | Urano et al. | 430/270.1 |
| 5,670,299 | 9/1997 | Urano et al. | 430/270.1 |
| 5,679,495 | 10/1997 | Yamachika et al. | 430/270.1 |

FOREIGN PATENT DOCUMENTS

| | | |
|---|---|---|
| 0 520 642 | 12/1992 | European Pat. Off. . |
| 0 660 187 | 6/1995 | European Pat. Off. . |
| 2-161436 | 6/1990 | Japan . |
| 2-27660 | 6/1990 | Japan . |
| 3-44290 | 7/1991 | Japan . |
| 4-39665 | 6/1992 | Japan . |
| 5-249682 | 9/1993 | Japan . |
| 7-140666 | 6/1995 | Japan . |

*Primary Examiner*—John S. Chu
*Attorney, Agent, or Firm*—Oblon, Spivak, McClelland, Maier & Neustadt, P.C.

[57] ABSTRACT

A radiation sensitive composition comprising (A) a copolymer comprising recurring units of a p-hydroxystyrene unit and a styrene unit having an acetal group or a ketal group at the p-position, (B) a copolymer comprising recurring units of a t-butyl (meth)acrylate unit and a p-hydroxystyrene unit, and (C) a radiation sensitive acid-generating agent.

14 Claims, No Drawings

RADIATION SENSITIVE COMPOSITION

DETAILED DESCRIPTION OF THE INVENTION

This invention relates to a radiation sensitive composition. More specifically, it relates to a radiation sensitive composition which is useful as a resist suitable for microprocessing, using a variety of radiations such as ultraviolet, far ultraviolet, X- or charged corpuscule rays.

In the field of microprocessing used for the production of integrated circuit devices, rapid progress is being made in fining of a design rule in lithography to achieve higher integration for an integrated circuit, and in recent years, the development of a lithographic process which allows for high-precision and stable formation of a fine pattern having a line width of 0.5 µm or less has been expedited markedly. It is difficult, however, to form such a fine pattern with high precision by a conventional process using visible rays (wavelength of 700 to 400 nm) or near ultraviolet rays (wavelength of 400 to 300 nm). Therefore, there have been proposed lithographic processes which use radiation having short wavelengths (of not more than 300 nm) which is effective in making a design rule more finer.

The lithographic processes using radiation having such short wavelength include, for example, ones which use far ultraviolet rays from a KrF excimer laser (wavelength of 248 nm) or ArF excimer laser (wavelength of 193 nm), X-rays such as synchrotron radiation, and charged corpuscule rays such as electron beams. As a high resolution resist for use with such radiation having short wavelengths, International Business Machine (IBM) has proposed a "chemically amplifying resist" which is now being improved energetically.

The chemically amplifying resist generates acid when a radiation sensitive acid-generating agent contained therein is irradiated with radiation (to be referred to as "exposure" hereinafter). The catalytic function of this acid causes a chemical reaction (such as change in polarity, cleavage of chemical bonding, crosslinking reaction or the like) in a resist film and forms a pattern, making use of a phenomenon that the solubility of an exposed portion in a developer changes.

Of the conventional chemical amplifying resists, there are known resists which show relatively good resist performance, such as one comprising, as a resin component, a resin in which an alkali affinity group in an alkali-soluble resin is protected by a t-butyl ester group or a t-butoxycarbonyl group (refer to JP-B 2-27660) (the term "JP-B" as used herein means an "examined Japanese patent publication"), one comprising, as a resin component, a resin in which an alkali affinity group in an alkali-soluble resin is protected by a silyl group (refer to JP-B 3-44290), one comprising, as a resin component, a resin which contains a (meth)acrylic acid component (refer to JP-B 4-39665), one comprising, as a resin component, a resin in which an alkali affinity group in an alkali-soluble resin is protected by a ketal group (refer to JP-A 7-140666) (the term "JP-A" as used herein means an "unexamined published Japanese patent application"), and one comprising, as a resin component, a resin in which an alkali affinity group in an alkali-soluble resin is protected by an acetal group (refer to JP-A 2-161436 and JP-A 5-249682).

However, it has been pointed out that these chemically amplifying resists have problems of their own and involve difficulties in practical application.

One of the big problems is that the line width of a resist pattern will change or become of a T-shape due to a post exposure time delay from exposure to post-baking (to be abbreviated as "PED" hereinafter).

Further, in addition to changes in pattern shape and the line width of a resist pattern caused by PED, the chemically amplifying resists have large dependence upon resolution and baking temperature and are unsatisfactory in process stability. Therefore, further improvement has been desired from a viewpoint of the overall characteristics of a chemically amplifying resist.

It is an object of the present invention to provide a radiation sensitive composition useful as a chemically amplifying positive resist which is effectively sensitive to radiation such as ultraviolet, far ultraviolet, X- or charged corpuscule rays, is excellent in resolution, developability, pattern shape and stability against PED, has small dependence upon baking temperature and excellent process stability, and is capable of forming a high-precision fine pattern stably.

According to the present invention, the above object can be attained by a radiation sensitive composition comprising:

(A) a copolymer (to be referred to as "copolymer (A)" hereinafter) which comprises a recurring unit represented by the following formula (1):

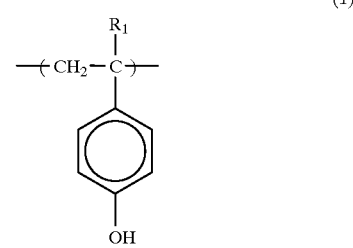

wherein $R_1$ is a hydrogen atom or a methyl group, and a recurring unit represented by the following formula (2):

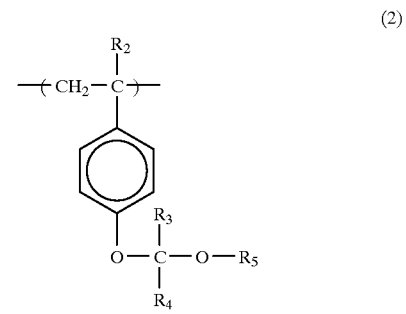

wherein $R_2$ is a hydrogen atom or a methyl group, $R_3$ is a hydrogen atom, an alkyl group having 1 to 10 carbon atoms, a cyclic alkyl group having 3 to 10 carbon atoms, an aryl group having 6 to 10 carbon atoms or an aralkyl group having 7 to 11 carbon atoms, $R_4$ and $R_5$ are independently an alkyl group having 1 to 10 carbon atoms, a haloalkyl group having 1 to 10 carbon atoms, a cyclic alkyl group having 3 to 10 carbon atoms, an aryl group having 6 to 10 carbon atoms, or an aralkyl group having 7 to 11 carbon atoms, or any two of $R_3$, $R_4$ and $R_5$ may be bonded together to form a 5- to 7-membered ring;

(B) a copolymer (to be referred to as "copolymer (B)" hereinafter) comprising a recurring unit represented by the following formula (3) and the recurring unit represented by the above formula (1):

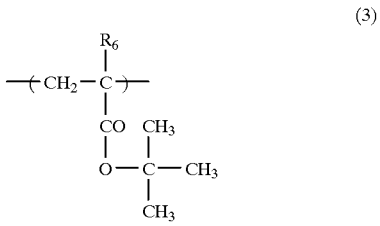

(3)

wherein $R_6$ is a hydrogen atom or a methyl group; and (C) a radiation sensitive acid-generating agent.

The object, constitution and effect of the present invention will be apparent from the following description.

Copolymer (A)

The copolymer (A) used in the present invention is a copolymer which comprises a recurring unit (to be referred to as "recurring unit (1)" hereinafter) represented by the above formula (1) and a recurring unit (to be referred to as "recurring unit (2)" hereinafter) represented by the above formula (2).

In the formula (1), $R_1$ is a hydrogen atom or a methyl group.

In the formula (2), $R_2$ is a hydrogen atom or a methyl group.

$R_3$ is a hydrogen atom, an alkyl group having 1 to 10 carbon atoms, a cyclic alkyl group having 3 to 10 carbon atoms, an aryl group having 6 to 10 carbon atoms, or an aralkyl group having 7 to 11 carbon atoms.

Illustrative examples of the alkyl group having 1 to 10 carbon atoms, which may be straight-chain or branched-chain, include methyl, ethyl, n-propyl, i-propyl, n-butyl, i-butyl, sec-butyl, t-butyl, n-pentyl, neopentyl, n-hexyl, n-heptyl, n-octyl, 2-ethylhexyl, n-nonyl, n-decyl and the like.

Illustrative examples of the cyclic alkyl group having 3 to 10 carbon atoms include cyclopropyl, cyclobutyl, cyclopentyl, cyclohexyl, cycloheptyl, cyclooctyl, norbornyl, isobornyl and the like.

Illustrative examples of the aryl group having 6 to 10 carbon atoms include phenyl, tolyl, xylyl, cumenyl, 1-naphthyl and the like.

Illustrative examples of the aralkyl group having 7 to 11 carbon atoms include benzyl, α-methylbenzyl, phenethyl, naphthylmethyl and the like.

Further, in the formula (2), $R_4$ and $R_5$ are each independently an alkyl group having 1 to 10 carbon atoms, a haloalkyl group having 1 to 10 carbon atoms, a cyclic alkyl group having 3 to 10 carbon atoms, an aryl group having 6 to 10 carbon atoms, or an aralkyl group having 7 to 11 carbon atoms. Illustrative examples of the above groups except the haloalkyl group are the same as those listed above. Illustrative examples of the haloalkyl group include trifluoroethyl, hexafluoropropyl, heptadecafluorodecyl and the like.

Any of $R_3$, $R_4$ and $R_5$ may be bonded together to form a 5- to 7-membered ring. Illustrative examples of the 5- to 7-membered ring when $R_3$ and $R_4$ are bonded together include cyclopentyl, cyclohexyl and cycloheptyl groups. Illustrative examples of the 5- to 7-membered ring when $R_3$ and $R_5$ or $R_4$ and $R_5$ are bonded together include tetrahydrofuranyl and tetrahydropyranyl groups.

The group represented by the following formula (2)-1 in the above formula (2):

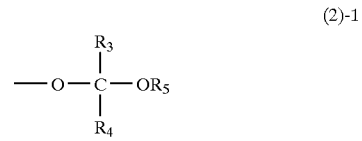

(2)-1 wherein $R_3$, $R_4$ and $R_5$ are defined the same as in the above formula (2), is a group called "acetal group" or "ketal group".

Illustrative examples of the acetal group include 1-methoxyethoxy, 1-ethoxyethoxy, 1-n-propoxyethoxy, 1-i-propoxyethoxy, 1-n-butoxyethoxy, 1-i-butoxyethoxy, 1-sec-butoxyethoxy, 1-t-butoxyethoxy, 1-cyclopentyloxyethoxy, 1-cyclohexyloxyethoxy, 1-norbornyloxyethoxy, 1-bornyloxyethoxy, 1-phenyloxyethoxy, 1-(1-naphthyloxy)ethoxy, 1-benzyloxyethoxy, 1-phenethyloxyethoxy, (cyclohexyl)(methoxy)methoxy, (cyclohexyl)(ethoxy) methoxy, (cyclohexyl) (n-propoxy)methoxy, (cyclohexyl)(i-propoxy)methoxy, (cyclohexyl)(cyclohexyloxy)methoxy, (cyclohexyl)(phenoxy)methoxy, (cyclohexyl)(benzyloxy) methoxy, (phenyl)(methoxy)methoxy, (phenyl)(ethoxy) methoxy, (phenyl)(n-propoxy)methoxy, (phenyl)(i-propoxy) methoxy, (phenyl)(cyclohexyloxy)methoxy, (phenyl) (phenoxy)methoxy, (phenyl)(benzyloxy)methoxy, (benzyl) (methoxy)methoxy, (benzyl)(ethoxy)methoxy, (benzyl)(n-propoxy)methoxy, (benzyl)(i-propoxy)methoxy, (benzyl) (cyclohexyloxy)methoxy, (benzyl)(phenoxy)methoxy, (benzyl)(benzyloxy)methoxy, 2-tetrahydrofuranyloxy, 2-tetrahydropyranyloxy and the like.

Illustrative examples of the ketal group include 1-methyl-1-methoxyethoxy, 1-methyl- 1-ethoxyethoxy, 1-methyl-1-n-propoxyethoxy, 1-methyl-1-i-propoxyethoxy, 1-methyl-1-n-butoxyethoxy, 1-methyl-1-i-butoxyethoxy, 1-methyl-1-sec-butoxyethoxy, 1-methyl-1-t-butoxyethoxy, 1-methyl-1-cyclopentyloxyethoxy, 1-methyl-1-cyclohexyloxyethoxy, 1-methyl-1-norbornyloxyethoxy, 1-methyl-1-bornyloxyethoxy, 1-methyl-1-phenyloxyethoxy, 1-methyl-1-(1-naphthyloxy)ethoxy, 1-methyl-1-benzyloxyethoxy, 1-methyl-1-phenethyloxyethoxy, 1-cyclohexyl-1-methoxyethoxy, 1-cyclohexyl-1-ethoxyethoxy, 1-cyclohexyl-1-n-propoxyethoxy, 1-cyclohexyl-1-i-propoxyethoxy, 1-cyclohexyl-1-cyclohexyloxyethoxy, 1-cyclohexyl-1-phenoxyethoxy, 1-cyclohexyl-1-benzyloxyethoxy, 1-phenyl-1-methoxyethoxy, 1-phenyl-1-ethoxyethoxy, 1-phenyl-1-n-propoxyethoxy, 1-phenyl-1-i-propoxyethoxy, 1-phenyl-1-cyclohexyloxyethoxy, 1-phenyl-1-phenyloxyethoxy, 1-phenyl-1-benzyloxyethoxy, 1-benzyl-1-methoxyethoxy, 1-benzyl-1-ethoxyethoxy, 1-benzyl-1-n-propoxyethoxy, 1-benzyl-1-i-propoxyethoxy, 1-benzyl-1-cyclohexyloxyethoxy, 1-benzyl-1-phenyloxyethoxy, 1-benzyl-1-benzyloxyethoxy, 2-(2-methyl-tetrahydrofuranyl)oxy, 2-(2-methyl-tetrahydropyranyl)oxy, 1-methoxy-cyclopentyloxy, 1-methoxy-cyclohexyloxy and the like.

The recurring units (1) and (2) may be present alone or in combination of two or more in the copolymer (A).

The content of the recurring unit (2) in the copolymer (A) is 10 to 60 mol %, preferably 20 to 50 mol %, more preferably 25 to 45 mol %, based on the total of the recurring units (1) and (2). When the content is less than 10 mol %, the resolution of a resist formed from the resulting composition is liable to deteriorate, while when the content is more than 60 mol %, the sensitivity of the resist is liable to lower.

The above copolymer (A) can be produced by the following methods, for example.

(a) A method for producing a polymer comprising the recurring unit of the above formula (1) and the recurring unit of the above formula (2), which comprises preparing a vinyl aromatic (co)polymer having a phenolic hydroxyl group (to be referred to as "phenolic hydroxyl group-containing polymer" hereinafter) such as poly(p-hydroxystyrne or poly(p-isopropenylphenyl) and etherifying it by reacting part of its hydroxyl groups with a compound such as ethyl vinyl ether, 2,3-dihydropyran, 4-methoxy-5,6-dihydro-2H-pyran or 2-methoxypropylene.

(b) A method comprising etherifying a sodium phenoxide derivative of a phenolic hydroxyl group-containing polymer and a compound represented by the formula Cl—CH($R_3$) ($R_4$)O$R_5$ (in which $R_3$, $R_4$ and $R_5$ are the same as $R_3$, $R_4$ and $R_5$ in the formula (2)) through a reaction for removing sodium chloride.

(c) A method comprising directly copolymerizing vinyl aromatic compounds corresponding to the above formulas (1) and (2).

The weight average molecular weight (to be abbreviated as "Mw" hereinafter) in terms of polystyrene, measured by gel permeation chromatography (to be abbreviated as "GPC" hereinafter), of the copolymer (A) is generally 1,000 to 100,000, preferably 3,000 to 40,000, more preferably 3,000 to 30,000.

When Mw is less than 1,000, the sensitivity and heat resistance of a resist formed from the resulting composition are liable to deteriorate, while when Mw is more than 100,000, the solubility of the exposed region of the resist in a developer is liable to lower.

Copolymer (B)

The copolymer (B) used in the present invention is a copolymer comprising a recurring unit (to be referred to as "recurring unit (3)" hereinafter) represented by the above formula (3) and the recurring unit (1).

The content of the recurring unit (1) in the copolymer (B) is generally 30 to 80 mol %, preferably 35 to 75 mol %, more preferably 40 to 70 mol %. When the content is less tan 30 mol %, the sensitivity of a resist formed from the resulting composition is liable to lower, while when the content is more than 80 mol %, the developability of the resist is very liable to deteriorate.

The content of the recurring unit (3) in the copolymer (B) is generally 20 to 70 mol %, preferably 20 to 60 mol %, more preferably 30 to 50 mol %. When the content is less than 20 mol %, the resolution of a resist formed from the resulting composition is liable to lower, while when the content is more than 80 mol %, the dry etching resistance of the resist is liable to deteriorate.

The copolymer (B) may contain a recurring unit (to be referred to as "recurring unit (4)" hereinafter) of another monomer which is copolymerizable with the recurring units (1) and (3), in addition to the recurring units (1) and (3). The recurring unit (4) is copolymerized with a view to improve pattern shape and resolution, and is derived from a monomer having low solubility in an alkali developer, i.e., a monomer having no acidic hydroxyl group such as a sulfonic acid group, carboxyl group, phenolic hydroxyl group or the like. Illustrative examples of the monomer (to be referred to as "monomer (4)" hereinafter) include vinyl group-containing compounds, (meth)acrylamide compounds, (meth)acrylic acid esters and the like.

The vinyl group-containing compounds include aromatic vinyl compounds such as styrene, α-methylstyrene, p-methylstyrene and chlorostyrene; hetero atom-containing alicyclic vinyl compounds such as vinylpyrrolidone and vinylcaprolactam; and cyano group-containing vinyl compounds such as acrylonitrile and methacrylonitrile.

The (meth)acrylamide compounds include acrylamide, methacrylamide, N-methylolacrylamide and the like.

The (meth)acrylic acid esters include alkyl (meth) acrylates such as methyl (meth)acrylate and ethyl (meth) acrylate, hydroxyethyl (meth)acrylate, phenyl (meth) acrylate, isobornyl (meth)acrylate and the like.

The preferred content of the recurring unit (4) differs depending on the proportions of the recurring units (1) and (3). It is generally 0 to 40 mol %, preferably 0 to 30 mol %, more preferably 5 to 25 mol %, based on the total of all the recurring units of the copolymer (B). When the content is more than 40 mol %, solubility in a developer tends to lower.

The above copolymer (B) can be produced by directly copolymerizing p-hydroxystyrene or p-isopropenylphenol and t-butyl (meth)acrylate with the monomer (4).

The Mw of the copolymer (B) is generally 1,000 to 100,000, preferably 3,000 to 40,000, more preferably 3,000 to 30,000.

When Mw is less than 3,000, the sensitivity and heat resistance of a resist formed from the resulting composition are liable to deteriorate, while when it is more than 100,000, the solubility of the resist in a developer is liable to lower.

The copolymers (B) may be used alone or in admixture of two or more.

In the present invention, the weight ratio (A)/(B) of the copolymer (A) to the copolymer (B) is 10/90 to 90/10, preferably 40/60 to 90/10, more preferably 50/50 to 90/10, the most preferably 70/30 to 90/10, based on 100 parts by weight of the total of the copolymer (A) and the copolymer (B).

Radiation sensitive acid-generating agent

The radiation sensitive acid-generating agent is a compound which generates acid when it is exposed to radiation. The radiation sensitive acid-generating agent used in the present invention is (1) an onium salt, (2) a sulfone compound, (3) a sulfonic acid ester compound, (4) a sulfonimide compound, (4) a diazomethane compound or the like.

Illustrative examples of these radiation sensitive acid-generating agents are provided below.

(1) onium salt:

The onium salt is an iodonium salt, sulfonium salt, phophonium salt, diazonium salt, ammonium salt, pyridinium salt or the like.

Onium salt compounds are exemplified by diphenyliodonium trifluoromethanesulfonate, diphenyliodonium pyrenesulfonate, diphenyliodonium dodecylbenzylsulfonate, triphenylsulfonium trifluoromethanesulfonate, triphenylsulfonium hexafluoroantimonate, diphenyliodonium hexafluoroantimonate, triphenylsulfonium naphthalene sulfonate, triphenylsulfonium camphor sulfonate, (hydroxyphenyl)benzylmethylsulfonium toluene sulfonate, 4-hydroxy-1-naphthyltetrahydrothiophenium trifluoromethane sulfonate and the like.

(2) sulfone compound:

The sulfone compound is β-ketosulfone, β-sulfonylsulfone or α-diazo compound thereof.

Illustrative examples of the sulfone compound include phenacyl phenyl sulfone, mesityl phenacyl sulfone, bis (phenylsulfonyl)methane, 4-trisphenacyl sulfone and the like.

(3) sulfonic acid ester compound:

The sulfonic acid ester compound is an alkyl sulfonic acid ester, haloalkyl sulfonic acid ester, aryl sulfonic acid ester, iminosulfonate or the like.

Illustrative examples of the sulfonic acid ester compound include benzointosylate, pyrogallol tris (trifluoromethanesulfonate), pyrogallol methane sulfonic acid triester, nitrobenzyl-9,10-diethoxyanthracene-2-sulfonate, α-methylolbenzointosylate, α-methylolbenzoin octanesulfonic acid ester, α-methylolbenzointrifluoromethane sulfonic acid ester, α-methylolbenzoin dodecylsulfonic acid ester and the like.

(4) sulfonimide compound:

The sulfonimide compound is a compound represented by the following formula (4):

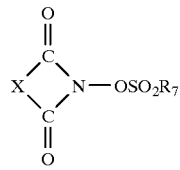

(4)

wherein X is a divalent group such as alkylene group, arylene group or alkoxylene group, and $R_7$ is a monovalent group such as alkyl group, aryl group, halogen-substituted alkyl group or halogen-substituted aryl group.

Illustrative examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hepto-5-en-2, 3-dicarboxyimide, N-(trifluoromethylsulfonyloxy)-7-oxabicyclo[2.2.1]-hepto-5-en-2,3-dicarboxyimide, N-(trifluoromethylsulfonyloxy)naphthylimide, N-(trifluoromethylsulfonyloxy)bicyclo[2.2.1]heptane-5,6-oxy- 2,3-dicarboxyimide, N-(camphorsulfonyloxy) succinimide, N-(camphorsulfonyloxy)phthalimide, N-(camphorsulfonyloxy)diphenylmaleimide, N-(camphorsulfonyloxy)bicyclo[2.2.1]hepto-5-en-2,3-dicarboxyimide, N-(camphorsulfonyloxy)-7-oxabicyclo[2.2.1]hepto-5-en-2,3-dicarboxyimide, N-(camphorsulfonyloxy)naphthylimide, N-(camphorsulfonyloxy)bicyclo[2.2.1]heptane-5,6-oxy-2, 3-dicarboxyimide, N-(4-methylphenylsulfonyloxy) succinimide, N-(camphorsulfonyloxy) naphthyldicarboxyimide, N-(4-methylphenylsulfonyloxy) phthalimide, N-(4-methylphenylsulfonyloxy) diphenylmaleimide, N-(4-methylphenylsulfonyloxy)bicyclo [2.2.1]hepto-5-en-2,3-dicarboxyimide, N-(4-methylphenylsulfonyloxy)-7-oxabicyclo[2.2.1]hepto-5-en-2,3-dicarboxyimide, N-(4-methylphenylsulfonyloxy) naphthylimide, N-(4-methylphenylsulfonyloxy)bicyclo [2.2.1]heptane-5,6-oxy-2,3-dicarboxyimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1] hepto-5-en-2,3-dicarboxyimide, N-(2-trifluoromethylphenylsulfonyloxy)-7-oxabicyclo[2.2.1] hepto-5-en-2,3-dicarboxyimide, N-(2-trifluoromethylphenylsulfonyloxy)naphthylimide, N-(2-trifluoromethylphenylsulfonyloxy)bicyclo[2.2.1]heptane-5, 6-oxy-2,3-dicarboxyimide, N-(2-trifluoromethylphenylsulfonyloxy)naphthylimide, N-(4-fluorophenylsulfonyloxy)succinimide, N-(2-fluorophenyl) phthalimide, N-(4-fluorophenylsulfonyloxy) diphenylmaleimide, N-(4-fluorophenylsulfonyloxy)bicyclo [2.2.1]hepto-5-en-2,3-dicarboxyimide, N-(trifluoromethylsulfonyloxy)-7-oxabicyclo[2.2.1]hepto-5-en-2,3-dicarboxyimide, N-(4-fluorophenylsulfonyloxy) bicyclo[2.2.1]heptane-5,6-oxy- 2,3-dicarboxyimide, N-(4-fluorophenylsulfonyloxy)naphthyldicarboxyimide and the like.

(5) diazomethane compound:

The diazomethane compound is a compound represented by the following formula (5):

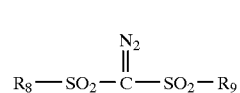

(5)

wherein $R_8$ and $R_9$ may be the same or different and are each a monovalent group such as alkyl group, aryl group, halogen-substituted alkyl group or halogen-substituted aryl group.

Illustrative examples of the diazomethane compound include bis(trifluoromethylsulfonyl)diazomethane, bis (cyclohexylsulfonyl)diazomethane, bis(phenylsulfonyl) diazomethane, bis(p-toluenesulfonyl)diazomethane, methylsulfonyl-p-toluenesulfonyl diazomethane, 1-cyclohexylsulfonyl-1-(1,1-dimethylethylsulfonyl) diazomethane, bis(1,1-dimethylethylsulfonyl)diazomethane and the like.

Of the above radiation sensitive acid-generating agents, preferred are (1) onium salts, (3) sulfonic acid ester compounds, (4) sulfonimide compounds and (5) diazomethane compounds and particularly preferred are triphenylsulfonium trifluoromethanesulfonate, α-methylol benzointosylate, α-methylol benzoin octanesulfonic acid ester, α-methylol benzoin trifluoromethane sulfonic acid ester, α-methylol benzoin dodecylsulfonic acid ester, pyrogallolmethane sulfonic acid triester, N-(trifluoromethylsulfonyloxy)bicyclo[2.2.1]hepto-5-en-2, 3-dicarboxyimide, N-(camphorsulfonyloxy)bicyclo[2.2.1] hepto-5-en-2,3-dicarboxyimide, N-(camphorsulfonyloxy) naphthyldicarboxyimide, bis(cyclohexylsulfonyl) diazomethane and the like.

In the present invention, the radiation sensitive acid-generating agent is used in an amount of 1 to 20 parts by weight, particularly preferably 1 to 10 parts by weight, based on 100 parts by weight of the total of the copolymer (A) and the copolymer (B). The above radiation sensitive acid-generating agents (to be referred to as "acid-generating agents" hereinafter) are used alone or in admixture of two or more.

Acid diffusion control agent

In the present invention, it is preferred to further comprise an acid diffusion control agent which has functions to control a phenomenon that acid generated from the acid-generating agent by exposure to radiation is diffused in a resist film and to suppress an unpreferred chemical reaction in unexposed regions. Use of such an acid diffusion control agent improves the storage stability of the composition and the resolution of a resist formed from the composition and can suppress variations in the line width of a resist pattern caused by fluctuations in PED, whereby extremely excellent process stability can be achieved.

As the acid diffusion control agent may be preferably used a nitrogen-containing organic compound whose basicity is not changed by exposure to radiation and baking. The nitrogen-containing organic compound includes a compound represented by the following formula (6) (to be referred to as "nitrogen-containing compound (I)" hereinafter):

$$R_{10}R_{11}R_{12}N \quad (6)$$

wherein $R_{10}$, $R_{11}$, and $R_{12}$ are independently a hydrogen atom, an alkyl group, an aryl group or an aralkyl group, a diamino compound having two nitrogen atoms in the molecule (to be referred to as "nitrogen-containing compound (II)" hereinafter), a polyamino polymer having three or more nitrogen atoms in the molecule (to be referred to as "nitrogen-containing compound (III)" hereinafter), an amide group-containing compound, an urea compound, a nitrogen-containing heterocyclic compound or the like.

Illustrative examples of the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; and aromatic amines such as aniline, N-methylaniline, N,N-dimethylaniline, 2-methylaniline, 3-methylaniline, 4-methylaniline, 4-nitroaniline, diphenylamine, triphenylamine and naphthylamine.

Illustrative examples of the nitrogen-containing compound (II) include ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene and the like.

Illustrative examples of the nitrogen-containing compound (III) include polymers such as polyethyleneimine, polyarylamine and dimethylaminoethylacrylamide. Illustrative examples of the amide group-containing compound include formamide, N-methylformamide, N,N-dimethylformamide, acetoamide, N-methylacetoamide, N,N-dimethylacetoamide, propionamide, benzamide, pyrrolidone, N-methylpyrrolidone and the like.

Illustrative examples of the urea compound include urea, methylurea, 1,1-dimethylurea, 1,3-dimethylurea, 1,1,3,3-tetramethylurea, 1,3-diphenylurea, tributylthiourea and the like.

Illustrative examples of the nitrogen-containing heterocyclic compound include imidazoles such as imidazole, benzimidazole, 4-methylimidazole and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline and acridine; pyrazine, pyrazol, pyridazine, quinoxaline, purine, pyrrolidine, piperidine, morpholine, 4-methylmorpholine, piperazine, 1,4-dimethylpiperazine, 1,4-diazabicyclo[2.2.2]octane and the like.

Of these nitrogen-containing compounds, the nitrogen-containing compounds (I) and the nitrogen-containing heterocyclic compounds are preferred. Of the nitrogen-containing compounds (I), trialkylamines are particularly preferred, and of the nitrogen-containing heterocyclic compounds, pyridines are particularly preferred.

In the present invention, the acid diffusion control agents may be used alone or in admixture of two or more.

The amount of the acid diffusion control agent used in the present invention is generally not more than 15 parts by weight, preferably 0.001 to 10 parts by weight, more preferably 0.005 to 5 parts by weight, based on 100 parts by weight of the total of the copolymers (A) and (B). When the amount of the acid diffusion control agent is more than 15 parts by weight, the sensitivity of a resist formed from the resulting composition and the developability of exposed portions are liable to lower. When the amount of the acid diffusion control agent is less than 0.001 part by weight, the pattern shape and the dimensional accuracy of the resist may deteriorate depending on the processing conditions.

Alkali-soluble resin

In the present invention, an alkali-soluble resin other than the copolymer (A) and the copolymer (B) may be added as required.

This alkali-soluble resin is a resin soluble in an alkali developer, which has at least one functional group showing affinity with an alkali developer, such as an acidic functional group exemplified by a phenolic hydroxyl group and a carboxyl group. Use of such an alkali-soluble resin makes it easy to control the solution speed of a resist film formed from the composition of the present invention in an alkali developer, with the result that developability can be further improved.

The alkali-soluble resin is not limited to a particular kind if it is soluble in an alkali developer. Preferred examples of the alkali-soluble resin include addition polymerization resins containing a recurring unit in which a polymerizable double bond portion of at least one monomer having an acidic functional group, such as hydroxystyrene, isopropenylphenol, vinyl benzoic acid, carboxymethylstyrene, carboxymethoxystyrene, (meth)acrylic acid, crotonic acid, maleic acid, fumaric acid, itaconic acid, citraconic acid, mesaconic acid, cinnamic acid or the like is cleaved; polycondensation resins containing a condensation recurring unit having an acidic functional group, such as novolak resins; and the like.

The alkali-soluble resin which is an addition polymerization resin may be composed of only the above recurring unit in which the polymerizable double bond portion of a monomer having an acidic functional group is cleaved. It, however, may further contain at least one other recurring unit if the produced resin is soluble in an alkali developer.

The above other recurring unit is a recurring unit in which a polymerizable double bond portion of a monomer such as styrene, α-methylstyrene, vinyltoluene, maleic anhydride, (meth)acrylonitrile, crotononitrile, maleinnitrile, fumaronitrile, mesaconnitrile, citraconnitrile, itaconnitrile, (meth)acrylamide, crotonamide, maleinamide, fumaramide, mesaconamide, citraconamide, itaconamide, vinylaniline, vinylpyridine, N-vinyl-ε-caprolactam, N-vinylpyrrolidone, N-vinylimidazole or the like is cleaved.

Of the above addition polymerization resins, particularly preferred are poly(hydroxystyrene) and poly(isopropenylphenol) because it has a high penetrability of radiation and excellent dry etching resistance when it is formed into a resist film.

The alkali-soluble resin which is a polycondensation resin may be composed of only a polycondensation recurring unit having an acidic functional group. It may further contain another recurring unit if the produced resin is soluble in an alkali developer.

The polycondensation resin can be produced, for example, by (co-)polycondensing at least one phenol and at least one aldehyde and optionally together with a polycondensing component capable of forming other polycondensation recurring unit(s), in a water medium or a mixed medium of water and a hydrophilic solvent in the presence of an acidic catalyst or a basic catalyst.

Illustrative examples of the phenol include o-cresol, m-cresol, p-cresol, 2,3-xylenol, 2,4-xylenol, 2,5-xylenol, 3,4-xylenol, 3,5-xylenol, 2,3,5-trimethylphenol, 3,4,5-trimethylphenol and the like. Illustrative examples of the aldehyde include formaldehyde, trioxan, paraformaldehyde, benzaldehyde, acetoaldehyde, propyl aldehyde, phenylacetoaldehyde and the like.

The amount of the alkali-soluble resin used in the present invention is generally not more than 200 parts by weight based on 100 parts by weight of the total of the copolymers (A) and (B).

Surfactant

The composition of the present invention may contain a surfactant.

Illustrative examples of the surfactant include polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate and polyethylene glycol distearate. Commercial products of the surfactant include F Top EF 301, EF303 and EF352 of Tochem Products Co., Ltd., Megafax F171 and F173 of Dainippon Ink and Chemicals, Inc., Florade FC430 and FC431 of Sumitomo 3M Limited., Asahi Guard AG710 Surflon S-382, SC101, SC102, SC103, SC104, SC105 and SC106 of Asahi Glass Co., Ltd., Organosiloxane Polymer KP341 of Shin-Etsu Chemical Co., Ltd., Polyflow No. 75 and No. 95 (which are acrylic acid or methacrylic acid (co)polymers) of Kyoeisha Yushi Kagaku K.K.

The amount of the surfactant is generally not more than 2 parts by weight based on 100 parts by weight of the total of the copolymers (A) and (B).

Sensitizer

The composition of the present invention may contain a sensitizer.

This sensitizer has functions to absorb the energy of radiation, transmit the energy to the radiation sensitive acid-generating agent and increase the amount of acid generated, and has the effect of improving the apparent sensitivity of a resist formed from the composition of the present invention. Preferred examples of the sensitizer include benzophenones, rose bengales, anthracenes and the like.

The amount of the sensitizer used is generally not more than 50 parts by weight based on 100 parts by weight of the total of the copolymers (A) and (B) in the composition.

Other additives

When the composition of the present invention contains a dye and/or a pigment, a latent image of exposed portions can be visualized and the influence of halation at the time of exposure to radiation can be alleviated. When it contains an adhesive aid, the adhesion thereof to a substrate can be further improved.

Further, the composition of the present invention may contain a halation inhibitor such as 4-hydroxy-4'-methylcalcon, shape improving agent, storage stabilizer, defoamer and the like as other additives.

Solvent

Before use, the composition of the present invention is dissolved in a solvent uniformly so as to allow the concentration of the total solid content to be 5 to 50 wt %, preferably 15 to 40 wt %, and filtered by a filter having, for example, a mesh size of 0.2 μm to be prepared as a composition solution.

Illustrative examples of the solvent used in the preparation of the composition solution include ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether and propylene glycol monobutyl ether; propylene glycol dialkyl ethers such as propylene glycol dimethyl ether, propylene glycol diethyl ether, propylene glycol dipropyl ether and propylene glycol dibutyl ether; propylene glycol monoalkyl ether acetates such as proyplene glycol monomethyl ether acetate, propylene glycol monoethyl ether acetate, propylene glycol monopropyl ether acetate and propylene glycol monobutyl ether acetate; lactic acid esters such as methyl lactate, ethyl lactate, n-propyl lactate and isopropyl lactate; aliphatic carboxylic acid esters such as n-amyl formate, isoamyl formate, ethyl acetate, n-propyl acetate, isopropyl acetate, n-butyl acetate, isobutyl acetate, n-amyl acetate, isoamyl acetate, isopropyl propionate, n-butyl propionate and isobutyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate and ethyl pyruvate; aromatic hydrocarbons such as toluene and xylene; ketones such as methyl ethyl ketone, methyl propyl ketone, methyl butyl ketone, 2-heptanone, 3-heptanone, 4-heptanone and cyclohexanone; amides such as N-methylformamide, N,N-dimethylformamide, N-methylacetoamide, N,N-dimethylacetoamide and N-methylpyrrolidone; and lactones such as γ-butyrolactone.

Formation of resist pattern

To form a resist pattern from the composition of the present invention, the composition solution prepared as described above is applied to a substrate such as a silicon wafer or a wafer covered with aluminum by appropriate coating means such as rotation coating, cast coating, roll coating or the like to form a resist film, and, as required, the resist film is further preheated (to be referred to "softbake" hereinafter) and then irradiated with radiation (to be referred to as "exposure" hereinafter) through a predetermined mask pattern. The radiation used is suitably selected from ultraviolet rays such as i-ray (wavelength of 365 nm); far ultraviolet rays from an ArF excimer laser (wavelength of 193 nm) and a KrF excimer laser (wavelength of 248 nm); X-rays such as synchrotron radiation; and charged corpuscule rays such as electron beam, depending on type of the radiation sensitive acid-generating agent. The exposure conditions such as exposure amount are suitably selected depending on the formulation of the composition of the present invention, kind of additives, and the like.

In the present invention, so as to improve the apparent sensitivity of the resist film, it is preferred to carry out a heat treatment after exposure (to be referred to as "post exposure bake" hereinafter). The heating condition varies depending on the formation of the composition of the present invention, kind of additives and the like, but generally 30 to 200° C., preferably 40 to 150° C.

Thereafter, the exposed resist film is generally developed with an alkali developer at 10 to 50° C. for 30 to 200 seconds to form a predetermined resist pattern.

As the alkali developer is used an alkaline aqueous solution prepared by dissolving an alkaline compound such as alkali metal hydroxides; aqueous ammonia; mono-, di- or tri-alkylamines; mono-, di- or tri-alkanol amines; heterocyclic amines; tetralkylammonium hydroxides; choline; 1,8-diazabicyclo-[5.4.0]-7-undecene or 1,5-diazabicyclo-

[4.3.0]-5-nonene or the like therein in such an amount that it has a concentration of generally 1 to 10 wt %, preferably 1 to 5 wt %.

The developer formed from the above alkaline aqueous solution may contain a water-soluble organic solvent such as methanol or ethanol or a surfactant in suitable amounts.

When the developer formed from the above alkaline aqeuous solution is used, washing with water is generally carried out after development.

Prior to the formation of a resist pattern, a protective film may be formed on the resist film to prevent the influence of basic impurities contained in an ambient atmosphere.

The following examples and comparative examples are given to further illustrate the present invention. It should be understood that the present invention is in no way limited to these examples.

The measurement of Mw and the evaluation of each resist are carried out in accordance with the following methods.

Mw

This was measured by gel permeation chromatography under analysis conditions of a flow rate of 1.0 ml/min., a column temperature of 40° C. and use of tetrahydrofuran as an eluting solvent, using GPC columns of Tosoh Co., Ltd. (two G2000 $H_{XL}$ columns, one G3000$H_{XL}$ column and one G4000$H_{XL}$ column) and monodisperse polystyrene as a reference.

Sensitivity

The amount of exposure required to form a line-and-space pattern (1L1S) having a line width of 0.3 $\mu$m to a width ratio of 1:1 in the formation of a resist pattern was taken as the optimum exposure amount. The sensitivity was evaluated based on this optimum exposure amount.

Resolution

The minimum size ($\mu$m) of a resist pattern which was resolved when exposed with the optimum exposure amount was taken as resolution.

Pattern shape

In a 0.3 $\mu$m line-and-space pattern, when the line width of an upper portion of the pattern was represented by La and the line width of a lower portion of the pattern was represented by Lb, the pattern of (0.9×Lb<La<1.1×Lb) was evaluated to have a "good" shape, the pattern of (0.9×Lb≧La) was shown as a "round-top" shape, which was bad, and the pattern of (La≧1.1×Lb) was shown as a "T-shape", which was bad.

Developability

The resist film of a composition was formed, and occurrence of scum or undeveloped portions after the formation of a pattern were examined through a scanning electron microscope.

Synthesis of copolymer (A)

Synthesis Example 1

24 Grams of poly(p-hydroxystyrene) (Mw of 12,000) was dissolved in 100 ml of dioxane and the resulting solution was bubbled with nitrogen for 30 minutes. To this solution was added 8 g of ethyl vinyl ether and 1 g of p-toluene sulfonic acid pyridinium salt as a catalyst, and a reaction was carried out for 12 hours. This reaction solution was added dropwise into a 1 wt % aqueous solution of ammonium to precipitate a copolymer. This copolymer was dried in a vacuum dryer at 50° C. for one night.

The thus obtained copolymer had an Mw of 15,000 and, from the results of measurement with $^{13}$C-NMR, was found to have such a structure that 45% of hydrogen atoms of the phenolic hydroxyl groups was substituted with a 1-ethoxyethyl group. This copolymer is taken as polymer A-1.

Synthesis Example 2

24 Grams of poly(p-hydroxystyrene) (Mw of 8,000) was dissolved in 100 ml of dioxane, and the resulting solution was bubbled with nitrogen for 30 minutes. To this solution was added 7.5 g of 2,3-dihydropyran and 0.4 g of p-toluene sulfonic acid pyridinium salt as a catalyst and a reaction was carried out for 6 hours. This reaction solution was added dropwise into a 1% aqueous solution of ammonium to precipitate a copolymer. This copolymer was dried in a vacuum dryer at 50° C. for one night.

The thus obtained copolymer had an Mw of 10,000 and an Mw/Mn ratio of 1.8 and, from the results of measurement with $^{13}$C-NMR, was found to have such a structure that 42% of hydrogen atoms of the phenolic hydroxyl groups was substituted with a tetrahydropyranyl group. This copolymer is taken as polymer A-2.

Synthesis Examples 3 to 6

Copolymers were synthesized in the same manner as in Synthesis Example 1 except that phenolic hydroxyl group-containing polymers and vinyl ether compounds shown in Table 1 were used. The analytical values of the copolymers are shown in Table 1. These copolymers are taken as polymers A-3 to A-6.

TABLE 1

| | Polyhydroxystyrene | | | | | Structure in which hydrogen atoms of | Substitution rate of phenolic | |
|---|---|---|---|---|---|---|---|---|
| | Mw | Amount charged (g) | Vinyl ether compound (g) | | Polymer | phenolic hydroxyl groups are substituted | hydroxyl groups (mol %) | Mw |
| Synthesis Example 3 | 12,000 | 24 | Methyl vinyl ether | 5 | A-3 | 1-methoxyethyl | 35 | 13,000 |
| Synthesis Example 4 | 12,000 | 24 | t-Butyl vinyl ether | 6 | A-4 | 1-t-butoxyethyl | 27 | 15,000 |
| Synthesis Example 5 | 15,000 | 24 | Cyclohexyl vinyl ether | 10 | A-5 | 1-cyclohexyloxyethyl | 39 | 19,000 |
| Synthesis Example 6 | 8,000 | 24 | Ethyl vinyl ether | 5 | A-6 | 1-ethoxyethyl | 32 | 10,000 |

Synthesis Example 7

120 g of a mixture consisting of 20 wt % of p-hydroxystyrene, 65 wt % of p-ethylphenol and 15 wt % of other components as impurities (10 wt % of water, 4 wt % of p-cresol and 1 wt % of phenol) were mixed with 19 g of p-methoxymethoxystyrene and 50 g of dioxane to prepare a uniform solution.

This solution was bubbled with nitrogen for 30 minutes and then, 1.9 g of 2,2'-azobis(4-methoxy-2,4-dimethylvaleronitrile) was added to the solution. Polymerization was carried out for 7 hours while maintaining a reaction temperature at 40° C. and continuing bubbling. After the completion of polymerization, the reaction solution was mixed with a large amount of hexane to solidify the produced copolymer. Thereafter, the operation of re-dissolving the copolymer in dioxane and solidifying it with hexane again was repeated several times to remove unreacted monomers completely. The copolymer was dried under reduced pressure at 50° C. to obtain a white copolymer (yield of 52%).

The thus obtained copolymer had an Mw of 17,000 and was found from the results of measurement with $^{13}$C-NMR, to have a copolymerization molar ratio of p-hydroxystyrene to p-methoxymethoxystyrene of 62:38. The polymer is taken as polymer A-7.

Synthesis of copolymer (B)

Synthesis Example 8

19 Grams of p-isopropenylphenol and 21 g of t-butyl methacrylate were mixed with 50 g of dioxane to prepare a uniform solution.

The solution was bubbled with nitrogen for 30 minutes and then, 1.9 g of 2,2-azobis(4-methoxy-2,4-dimethylvaleronitrile) was added thereto. Polymerization was conducted for 7 hours while maintaining a reaction temperature at 60° C. and continuing bubbling. After the completion of polymerization, the reaction solution was mixed with a large amount of hexane to solidify the produced copolymer. The operation of re-dissolving the copolymer in dioxane and solidifying it with hexane again was repeated several times to remove unreacted monomers completely. The copolymer was dried under reduced pressure at 50° C. to obtain a white copolymer (yield of 52%).

The thus obtained copolymer had an Mw of 27,000 and was found from the results of measurement with $^{13}$C-NMR to had a copolymerization molar ratio of p-isopropenylphenol to t-butyl methacrylate of 48:58. The polymer is taken as polymer B-1.

Synthesis Examples 9 to 12

Polymerization was carried out in the same manner as in Synthesis Example 8 excepting for use of monomer compositions shown in Table 2 to synthesize copolymers (B). The analytical values of the copolymers (B) are shown in Table 2. These copolymers are taken as copolymers B-2 to B-5.

TABLE 2

|  | Synthesis Example 9 | Synthesis Example 10 | Synthesis Example 11 | Synthesis Example 12 |
| --- | --- | --- | --- | --- |
| Copolymer | B-2 | B-3 | B-4 | B-5 |
| Amount of monomer charged (g) |  |  |  |  |
| p-isopropenylphenol | 18 | 17 | 14 | — |
| p-hydroxyphenol | — | — | — | 17 |
| t-butyl methacrylate | 19 | 18 | 20 | 21 |
| styrene | 3 | — | — | — |
| methacrylonitrile | — | 5 | — | 2 |
| 2-hydroxyethyl methacrylate | — | — | 6 | — |
| Composition of copolymer (mol %) |  |  |  |  |
| p-isopropenylphenol | 45 | 39 | 35 | — |
| p-hydroxyphenol | — | — | — | 45 |
| t-butyl methacrylate | 45 | 39 | 49 | 46 |
| styrene | 10 | — | — | — |
| methacrylonitrile | — | 22 | — | 9 |
| 2-hydroxyethyl methacrylate | — | — | 16 | — |
| Mw of copolymer | 18,000 | 21,000 | 17,000 | 16,000 |

Examples 1 to 12 and Comparative Examples 1 to 3

Components shown in Table 3 (parts are based on weight) were mixed to prepare a uniform solution which was then filtered with a membrane filter having a mesh size of 0.2 μm to prepare a composition solution.

Thereafter, each composition solution was applied to a silicon wafer by spin coating and softbaked at 90° C. for 120 seconds to form a 1.0 μm-thick resist film.

Thereafter, the resist film was exposed to a light from a KrF excimer laser (the NSR-2005EX8A stepper of Nikon Corp.), baked after exposure at 100° C. for 60 seconds, paddle-developed at 23° C. for 1 minute using a 2.38 wt % aqueous solution of tetramethyl ammonium hydroxide, washed with purified water, and dried to form a resist pattern.

The evaluation results of each resist are shown in Table 4.

TABLE 3

| | Copolymer (A) (parts) | | Copolymer (B) (parts) | | Acid-generating agent (C) (parts) | | Acid diffusion control agent (D) (parts) | | Solvent (parts) | |
|---|---|---|---|---|---|---|---|---|---|---|
| Ex. 1 | A-1 | 70 | B-1 | 30 | C-1 | 3 | a | 0.3 | EL | 400 |
| Ex. 2 | A-2 | 65 | B-1 | 35 | C-2 | 3 | a | 0.3 | EL | 400 |
| Ex. 3 | A-3 | 80 | B-1 | 20 | C-3 | 4 | — | — | MMP | 400 |
| Ex. 4 | A-4 | 70 | B-1 | 30 | C-3 | 4 | b | 0.2 | MMP | 400 |
| Ex. 5 | A-5 | 70 | B-1 | 30 | C-1 | 6 | b | 0.3 | PGMEA | 400 |
| Ex. 6 | A-6 | 70 | B-1 | 30 | C-2 | 6 | a | 0.6 | EL | 400 |
| Ex. 7 | A-7 | 70 | B-2 | 30 | C-3 | 8 | a | 0.7 | MMP | 400 |
| Ex. 8 | A-1 | 70 | B-3 | 30 | C-3 | 8 | b | 0.5 | PGMEA | 400 |
| Ex. 9 | A-2 | 70 | B-4 | 30 | C-1 | 6 | a | 0.6 | EL | 400 |
| Ex. 10 | A-3 | 70 | B-5 | 30 | C-2 | 6 | b | 0.5 | PGMEA | 400 |
| Ex. 11 | A-6 | 90 | B-1 | 10 | C-1 | 1 | b | 0.2 | PGMEA | 400 |
| | | | | | C-3 | 5 | | | | |
| Ex. 12 | A-6 | 80 | B-1 | 20 | C-4 | 2 | b | 0.2 | PGMEA | 400 |
| Comp. Ex. 1 | A-1 | 100 | — | — | C-1 | 3 | a | 0.3 | EL | 400 |
| Comp. Ex. 2 | A-6 | 100 | — | — | C-2 | 6 | — | — | PGMEA | 400 |

EX.: Example
Comp. Ex.: Comparative Example

TABLE 4

| | Sensitivity (mJ/cm²) | Resolution (μm) | Pattern shape | Developability |
|---|---|---|---|---|
| Ex. 1 | 40 | 0.25 | Good | Good |
| Ex. 2 | 36 | 0.24 | Good | Good |
| Ex. 3 | 32 | 0.25 | Good | Good |
| Ex. 4 | 41 | 0.26 | Good | Good |
| Ex. 5 | 38 | 0.25 | Good | Good |
| Ex. 6 | 37 | 0.25 | Good | Good |
| Ex. 7 | 46 | 0.24 | Good | Good |
| Ex. 8 | 41 | 0.23 | Good | Good |
| Ex. 9 | 40 | 0.25 | Good | Good |
| Ex. 10 | 42 | 0.23 | Good | Good |
| Ex. 11 | 28 | 0.23 | Good | Good |
| Ex. 12 | 22 | 0.24 | Good | Good |
| Comp. Ex. 1 | 37 | 0.24 | Good | Presence of scum |
| Comp. Ex. 2 | 21 | 0.30 | T-shape | Presence of scum |

EX.: Example
Comp. Ex.: Comparative Example

Abbreviations for the radiation sensitive acid-generating agent, acid diffusion control agent and solvent used in each Example and Comparative Example are as follows.
radiation sensitive acid-generating agent (acid generator)
  C-1: triphenyl sulfonium trifluoromethane sulfonate
  C-2: N-(camphorsulfonyloxy)naphthyl dicarboxyimide
  C-3: bis(cyclohexylsulfonyl)diazomethane
  C-4: 4-hydroxy-1-naphthyl tetrahydrothiophenium trifluoromethane sulfonate
acid diffusion control agent
  a: nicotinic acid amide
  b: trioctylamine
solvent
  EL: ethyl lactate
  MMP: 3-methoxymethyl propionate
  PGMEA: propylene glycol monomethyl ether acetate The radiation sensitive composition of the present invention is excellent in resolution, developability and pattern shape as well as PED stability, has small dependence on baking temperature and excellent process stability, and can form high-precision fine patterns stably. In addition, the radiation sensitive composition of the present invention is effectively sensitive to radiation such as ultraviolet, far ultraviolet, X- and charged corpuscule rays and is extremely useful as a chemically amplifying positive resist. Therefore, the radiation sensitive composition of the present invention can be suitably used for the production of semiconductor devices which will require much finer patterns in the future.

What is claimed is:
1. A radiation sensitive composition comprising:
   (A) a copolymer which comprises a recurring unit represented by the following formula (1):

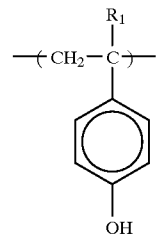

(1)

wherein $R_1$ is a hydrogen atom or a methyl group, and a recurring unit represented by the following formula (2):

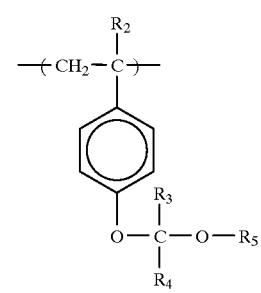

(2)

wherein $R_2$ is a hydrogen atom or a methyl group, $R_3$ is a hydrogen atom, an alkyl group having 1 to 10 carbon atoms, a cyclic alkyl group having 3 to 10 carbon atoms, an aryl group having 6 to 10 carbon atoms or an aralkyl group having 7 to 11 carbon atoms, $R_4$ and $R_5$ are each independently an alkyl group having 1 to 10 carbon atoms, a haloalkyl group having 1 to 10 carbon atoms, a cyclic alkyl group having 3 to 10 carbon atoms, an aryl group having 6 to 10 carbon atoms, or an aralkyl group having 7 to 11 carbon atoms, or any two of $R_3$, $R_4$ and $R_5$ may be bonded together to form a 5- to 7-membered ring;

(B) a copolymer comprising a recurring unit represented by the following formula (3) and the recurring unit represented by the above formula (1):

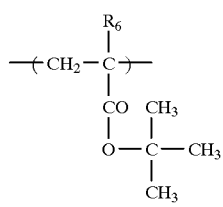

wherein $R_6$ is a hydrogen atom or a methyl group; wherein the weight ratio of the copolymer (A) to the copolymer (B) is 70/30 to 90/10; and (C) a radiation sensitive acid-generating agent.

2. The radiation sensitive composition of claim 1, wherein the copolymer (A) contains the recurring unit of the above formula (2) in a proportion of 10 to 60 mol % of the total of the recurring unit of the above formula (1) and the recurring unit of the above formula (2).

3. The radiation sensitive composition of claim 1, wherein the copolymer (A) has a weight average molecular weight in terms of polystyrene, measured by gel permeation chromatography, of 1,000 to 100,000.

4. The radiation sensitive composition of claim 1, wherein the copolymer (B) contains the recurring units of the above formula (1) in a proportion of 30 to 80 mol % of the total of the recurring units of the above formula (1) and the recurring units of the above formula (3).

5. The radiation sensitive composition of claim 1, wherein the copolymer (B) has a weight average molecular weight in terms of polystyrene, measured by gel permeation chromatography, of 1,000 to 100,000.

6. The radiation sensitive composition of claim 1, wherein the radiation sensitive acid-generating agent is selected from the group consisting of onium salts, sulfone compounds, sulfonic acid ester compounds, sulfonimide compounds and diazomethane compounds.

7. The radiation sensitive composition of claim 1, wherein the radiation sensitive acid-generating agent is contained in an amount of 1 to 20 parts by weight based on 100 parts by weight of the total of the copolymer (A) and the copolymer (B).

8. The radiation sensitive composition of claim 1 which further comprises a nitrogen-containing organic compound represented by the following formula (6):

$$R_{10}R_{11}R_{12}N \quad (6)$$

wherein $R_{10}$, $R_{11}$ and $R_{12}$ are each independently a hydrogen atom, an alkyl group, an aryl group or an aralkyl group.

9. The radiation sensitive composition of claim 8 which contains the nitrogen-containing organic compound in an amount of 0.001 to 10 parts by weight based on 100 parts by weight of the total of the copolymer (A) and the copolymer (B).

10. The radiation sensitive composition of claim 1, wherein the copolymer (A) contains the recurring unit of the formula (2) in a proportion of 20 to 50 mol % of the total of the recurring unit of the formula (1) and the recurring unit of the above formula (2).

11. The radiation sensitive composition of claim 1, wherein the copolymer (A) contains the recurring unit of the formula (2) in a proportion of 25 to 45 mol % of the total of the recurring unit of the formula (1) and the recurring unit of the formula (2).

12. A radiation sensitive composition comprising:

(A) a copolymer which comprises a recurring unit represented by the following formula (1):

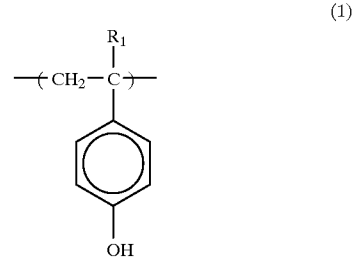

wherein $R_1$ is a hydrogen atom or a methyl group, and a recurring unit represented by the following formula (2):

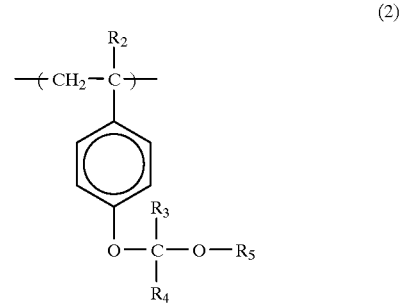

wherein $R_2$ is a hydrogen atom or a methyl group, $R_3$ is a hydrogen atom, an alkyl group having 1 to 10 carbon atoms, a cyclic alkyl group having 3 to 10 carbon atoms, a cyclic alkyl group having 3 to 10 carbon atoms, an aryl group having 6 to 10 carbon atoms or an aralkyl group having 7 to 11 carbon atoms, $R_4$ and $R_5$ are each independently an alkyl group having 1 to 10 carbon atoms, a haloalkyl group having 1 to 10 carbon atoms, a cyclic alkyl group having 3 to 10 carbon atoms, an aryl group having 6 to 10 carbon atoms or an aralkyl group having 7 to 11 carbon atoms;

(B) a copolymer comprising a recurring unit represented by the following formula (3) and the recurring unit represented by the above formula (1):

(3)

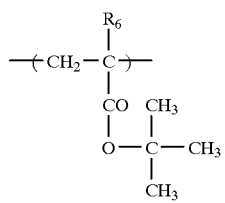

wherein $R_6$ is a hydrogen atom or a methyl group;

wherein the weight ratio of the copolymer (A) to the copolymer (B) is 70/30 to 90/10; and (C) a radiation sensitive acid-generating agent.

13. The radiation sensitive composition of claim 12, wherein in the formula (2), $R_3$ is hydrogen atom.

14. The radiation sensitive composition of claim 12, wherein in the formula (2) $R_5$ is an alkyl group having 1 to 10 carbon atoms or a cyclic alkyl group having 3 to 10 carbon atoms.

* * * * *